United States Patent
Naiss et al.

(10) Patent No.: US 9,558,109 B2
(45) Date of Patent: Jan. 31, 2017

(54) METHOD AND APPARATUS FOR FLASH MEMORY ARITHMETIC ENCODING AND DECODING

(71) Applicant: SAMSUNG ISRAEL RESEARCH CORPORATION, Ramat Gan (IL)

(72) Inventors: Iddo Naiss, Beer Yaakov (IL); Uri Beitler, Rehovot (IL); Eyal Calvo, Ramat-Gan (IL); Jun Jin Kong, Yongin-Si (KR)

(73) Assignee: SAMSUNG ISRAEL RESEARCH CORPORATION, Ramat Gan (IL)

( * ) Notice: Subject to any disclaimer, the term of this patent is extended or adjusted under 35 U.S.C. 154(b) by 355 days.

(21) Appl. No.: 14/245,677

(22) Filed: Apr. 4, 2014

(65) Prior Publication Data
US 2015/0286466 A1    Oct. 8, 2015

(51) Int. Cl.
*H03M 7/00*    (2006.01)
*G06F 12/02*   (2006.01)
*H03M 7/40*    (2006.01)

(52) U.S. Cl.
CPC ........ *G06F 12/0246* (2013.01); *H03M 7/4006* (2013.01)

(58) Field of Classification Search
CPC .... H03M 7/3079; H03M 7/4006; H03M 7/40; H03M 7/42; H03M 7/607; G06F 5/015; G06F 12/0246
USPC ............................................ 341/50, 51, 107
See application file for complete search history.

(56) References Cited

U.S. PATENT DOCUMENTS

| | | |
|---|---|---|
| 5,546,080 A | 8/1996 | Langdo, Jr. et al. |
| 6,081,213 A | 6/2000 | Hosaka |
| 6,259,388 B1 | 7/2001 | Zhao |
| 6,411,231 B1 | 6/2002 | Yanagiya et al. |
| 6,580,379 B2 | 6/2003 | Van Der Vleuten et al. |
| 6,765,515 B2 | 7/2004 | Miyamoto |
| 6,950,040 B2 | 9/2005 | Tsuru |
| 7,209,593 B2 | 4/2007 | Kimura et al. |
| 7,265,691 B2 * | 9/2007 | Tomic ............... H03M 7/40 341/50 |
| 7,522,076 B1 | 4/2009 | Hsu et al. |
| 7,808,406 B2 | 10/2010 | He et al. |
| 7,822,283 B2 | 10/2010 | Bossen |

(Continued)

FOREIGN PATENT DOCUMENTS

JP    2004-128619    4/2004
JP    2007-030444    2/2007

*Primary Examiner* — Jean B Jeanglaude
(74) *Attorney, Agent, or Firm* — F. Chau & Associates, LLC

(57) ABSTRACT

A method for reducing an amount of time needed for a single iteration of arithmetic encoding and arithmetic decoding is provided. Rescaling and range are calculated in parallel, range being a High parameter bound of a symbol-interval—a Low parameter bound of the symbol-interval+1. A new iHigh (iH) parameter and a new iLow (iL) parameter or a given/decoded symbol is found according to a cumulative frequency for an ith symbol. iH parameter and iL parameter rescaling is performed by shifting an amount of most significant bits of iH, iL in accordance with values of iH and iL. iRange is shifted to the left in accordance with a number of digits needed to represent iRange and a total number of bits reserved for iRange. A shifted iRange is divided by CF[N] and saved to Step_tmp while awaiting a result of H,L rescaling.

8 Claims, 4 Drawing Sheets

(56) References Cited

U.S. PATENT DOCUMENTS

| | | | | |
|---|---|---|---|---|
| 7,982,641 B1 * | 7/2011 | Su | ................ | H03M 7/4006 |
| | | | | 341/107 |
| 8,711,019 B1 * | 4/2014 | Su | ................ | H03M 7/4006 |
| | | | | 341/107 |
| 8,907,823 B2 * | 12/2014 | Marpe | ............ | H03M 7/4006 |
| | | | | 341/107 |

* cited by examiner

METHOD AND APPARATUS FOR FLASH MEMORY ARITHMETIC ENCODING AND DECODING

BACKGROUND

Technical Field

The present disclosure relates to flash memory encoding/decoding, and, more particularly, to arithmetic coding used therewith.

Discussion of Related Art

Currently, memory devices such as memory cards, USB ports, and the like, have been getting smaller and cheaper to produce. NAND flash technology is a technology that helps make portable memory devices operate effectively. NAND flash technology uses floating-gate transistors connected in a way that resembles a NAND gate.

Such NAND flash memories can utilize arithmetic coding and corresponding encoders (algorithms which compress an input sequence) and decoders (algorithms which decompress an encoded output sequence) to implement the arithmetic coding. A need exists to improve the speed of such encoders/decoders and reduce the amount of time needed for a single iteration, which is particularly useful for all NAND flash memory devices.

SUMMARY

According to an exemplary embodiment of the present inventive concept, there is provided a method for reducing an amount of time needed for a single iteration of arithmetic encoding and arithmetic decoding. Rescaling and range are calculated in parallel, range being a High parameter (H) bound of a symbol-interval—a Low parameter (L) bound of the symbol-interval+1. A new iHigh parameter (iH) and a new iLow parameter (iL) are found for a given/decoded symbol according to a cumulative frequency CF[i] for an ith symbol, wherein iH=L+CF[i]*Step−1, iL=L+CF[i−1]*Step, and Step=Range/CF[N], N being an alphabet size. iH, iL rescaling is performed by shifting an amount of most significant bits (MSBs) of iH, iL in accordance with values of iH and iL. An iRange is shifted to the left in accordance with a number of digits needed to represent iRange and a total number of bits reserved for iRange, such that LeftShift=BitReserved−1−NumOfDig(iRange). A shifted iRange is divided by CF[N] and saved to a Step_tmp while awaiting a result of H,L rescaling to determine an adjustment needed for Step_tmp, wherein if Eq is a number of MSBs in iH and iL that are equal, and Op is following bits that holds iH[k]=0 and iL[k]=1, then Step=Step_tmp<<=(Eq+Op−LeftShift).

According to an exemplary embodiment of the present inventive concept, there is provided a method of arithmetic encoding and arithmetic decoding by a processor in a computer system, the method comprising: executing by the processor non-transitory computer program code stored on storage media, wherein the non-transitory computer program code includes instructions for implementing the method for reducing an amount of time needed for a single iteration of arithmetic encoding and arithmetic decoding described above.

According to an exemplary embodiment of the present inventive concept, there is provided a computer program product for arithmetic encoding and arithmetic decoding, the computer program product comprising: a non-transitory computer readable storage medium having computer readable program code embodied therewith, the computer readable program code comprising: computer readable program code configured to implement the method for reducing an amount of time needed for a single iteration of arithmetic encoding and arithmetic decoding described above.

According to an exemplary embodiment of the present inventive concept, there is provided a method for reducing an amount of time needed for rescaling during arithmetic encoding and arithmetic decoding. A coding interval spanning from a High parameter to a Low parameter is provided. In each iteration the coding interval is parted to sub-intervals according to a cumulative frequency vector containing appearances of each symbol. A sub-interval is selected according to a symbol that was encoded/decoded to provide a NewHigh parameter and a New Low parameter. How many most significant bits (MSBs) of the NewHigh parameter and the NewLow parameter are equal are determined and denoted by N. Sequential MSBs are found and denoted by M such that NewHigh[i]=0 and NewLow [i]=1, i>N+1 being a bit number. The NewHigh parameter and the NewLow parameter are shifted by N+M bits and the shifted parameters are respectively denoted as the High parameter and the Low parameter. The MSB of the High parameter is set and the MSB of the Low parameter is erased. N+M least significant bits (LSBs) of the High parameter are set and the LSBs of the low parameter are erased. For an encoding: the most significant bit of the High parameter is output, UnderCount=! (most significant bit of the High parameter) is output, and N−1 most significant bits of the High parameter are output. The new value of UnderCount is M, if N>0, and UnderCount+M otherwise. For a decoding: Bit=code[N+1] is saved, code is shifted by N+M and the MSB of a NewCode parameter is set to Bit, wherein the N+M LSBs of the NewCode parameter are N+M bits from a compressed stream.

According to an exemplary embodiment of the present inventive concept, there is provided a method of rescaling by a processor in a computer system performing arithmetic encoding and arithmetic decoding, the method comprising: executing by the processor non-transitory computer program code stored on storage media, wherein the non-transitory computer program code includes instructions for implementing the method for reducing an amount of time needed for rescaling during arithmetic encoding and arithmetic decoding described above.

According to an exemplary embodiment of the present inventive concept, there is provided a computer program product for fast rescaling by arithmetic encoding and arithmetic decoding, the computer program product comprising: a non-transitory computer readable storage medium having computer readable program code embodied therewith, the computer readable program code comprising: computer readable program code configured to implement the method for reducing an amount of time needed for rescaling during arithmetic encoding and arithmetic decoding described above.

The arithmetic encoding may be for an input sequence applied to NAND flash memory and the arithmetic decoding is for an encoded output sequence from a NAND flash memory.

The NAND flash memory may be an ×4 NAND flash memory.

DETAILED DESCRIPTION OF THE EMBODIMENTS

In computer science and information theory, data compression involves encoding information using fewer bits than the original representation. Lossless compression reduces bits by identifying and eliminating statistical redundancy.

Arithmetic coding is a form of encoding used in lossless data compression. Normally, a string of characters is represented using a fixed number of bits per character, as in the ASCII code. However, when a string is converted to arithmetic encoding, frequently used characters are stored with fewer bits and not-so-frequently occurring characters are stored with more bits, resulting in fewer bits used in total. Arithmetic coding differs from other forms of encoding such as Huffman coding in that rather than separating the input into component symbols and replacing each with a code, arithmetic coding encodes the entire message into a single number, a fraction n where (0.0≤n<1.0).

The arithmetic coder is based upon parting a "code interval" of integers, based upon the proportion of the appearances of the symbols out of an alphabet of size N. The bounds of each symbol-interval are calculated using the previous bounds denoted as High (H) and Low (L). Their difference is denoted by:

Range=High−Low+1

If CF[i] is denoted as the cumulative frequency for the ith symbol, then iLow=Low+CF[1−1]*Step iHigh=Low+CF[1]*Step−1 where

Step=Range/CF[N]

After the operations above, rescaling is done to iHigh and iLow by shifting them to the left, providing the new bounds High and Low for the next symbol iteration. In conventional schemes, the calculation of Step is done only after the rescaling is over.

Figure 1:
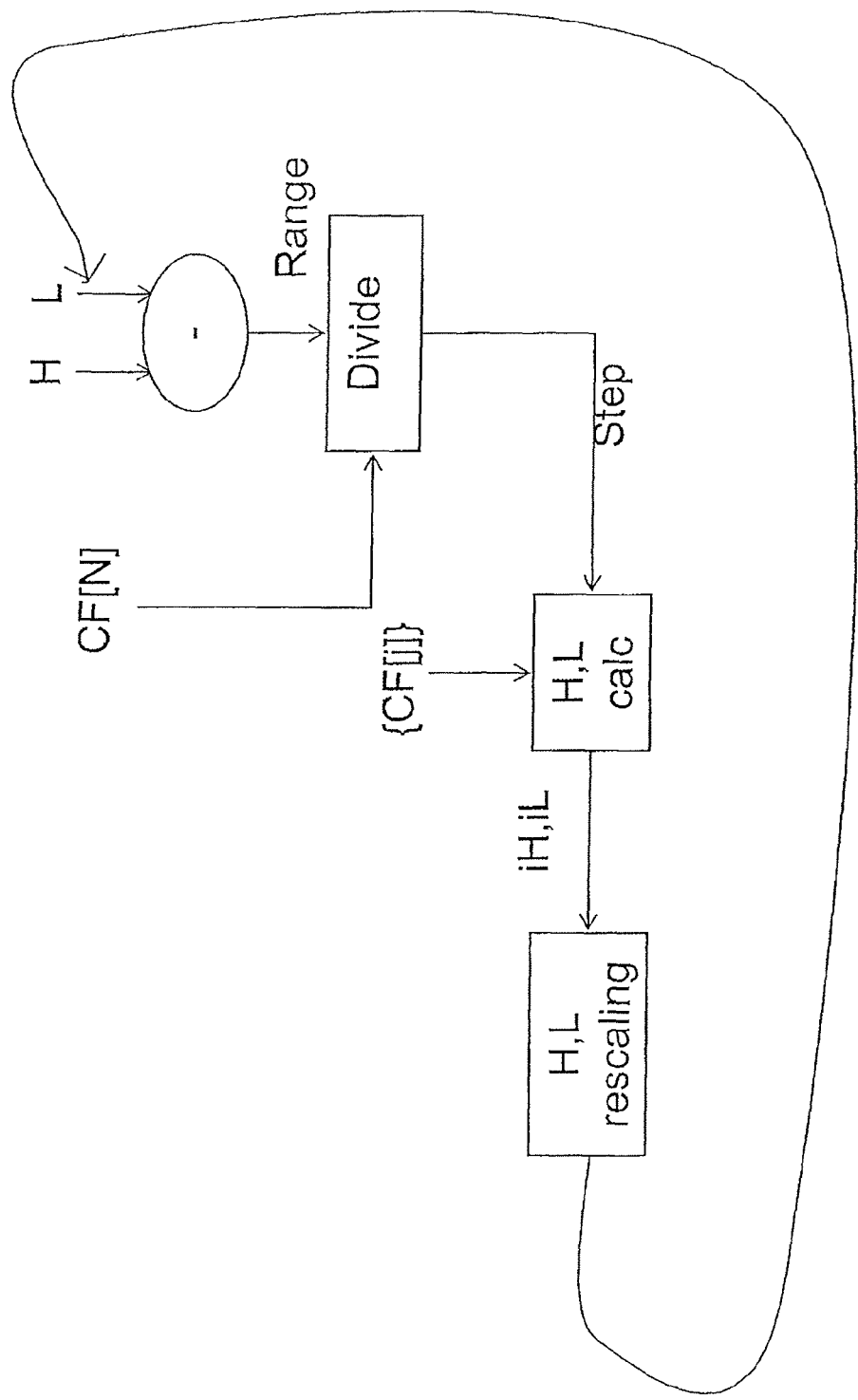
FIG. 1 is a block diagram depicting conventional arithmetic coding operations.

Referring to FIG. 1, the above-described conventional operations are depicted in block diagram form, wherein H,L calc finds the new iHigh, iLow for the symbol given/decoded, and H,L rescaling shifts out a certain amount of MSBs dependent on the values of iHigh and iLow.

Figure 2:
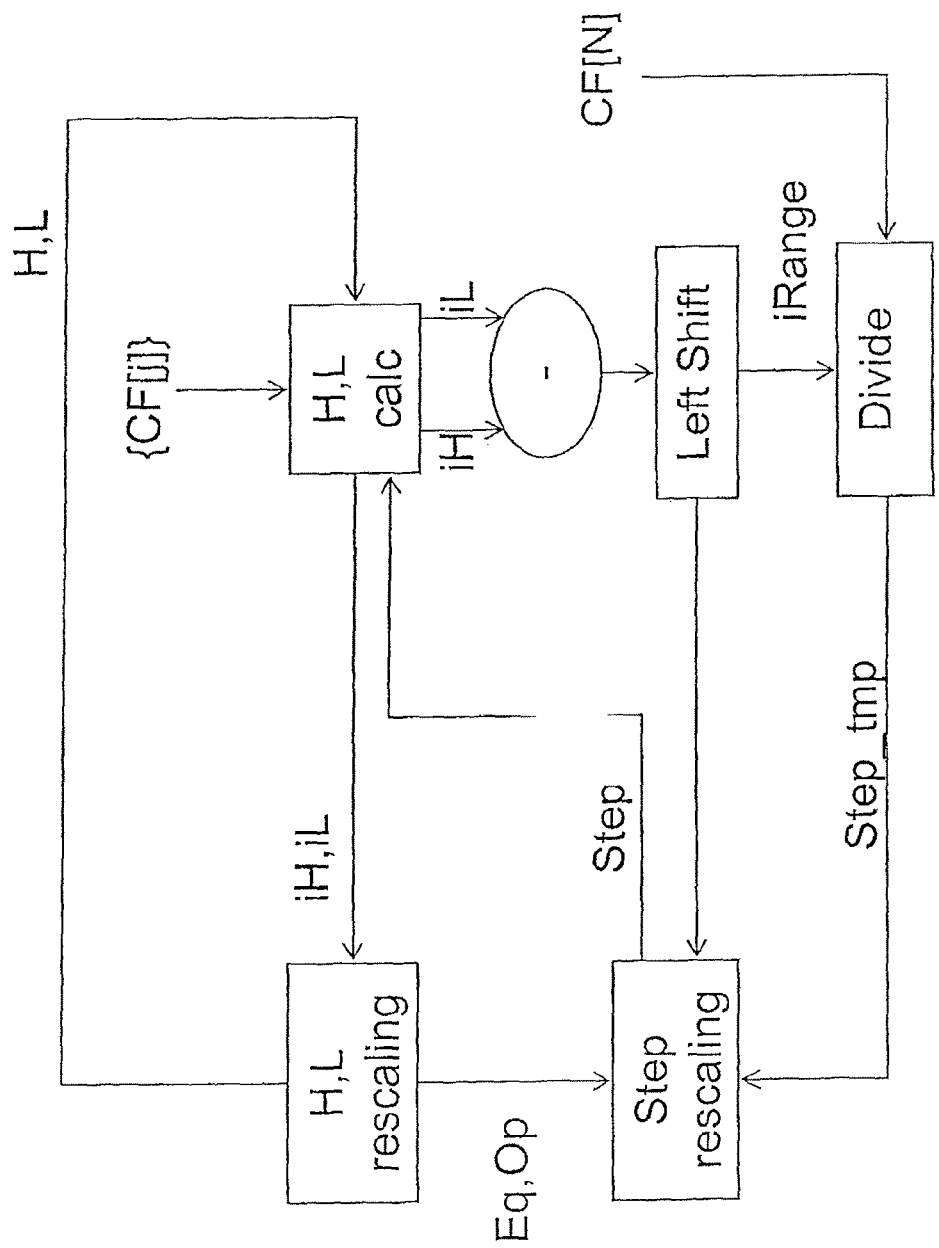
FIG. 2 is a block diagram depicting arithmetic coding operations according to an exemplary embodiment of the present inventive concept.

In accordance with an exemplary embodiment of the present inventive concept, referring to FIG. 2, the calculation for Step is started right after the H,L calc is undertaken.

Since at the time iH and iL are too close to be divided by CF[N], iRange must be shifted to the left. The amount of left-shifts is dependent upon the number of digits required to represent iRange, and the total number of bits reserved for iRange. The calculation is LeftShift=BitReserved−1−NumOfDig(iRange)

For instance, if the number of bits reserved is 5, and iRange is a 3 bit number, then LeftShift will be 1.

After shifting iRange, it is divided by CF[N] and saved to Step_tmp, and awaits the result of block H,L rescaling to determine an adjustment needed for Step_tmp.

Let Eq be the number of MSBs in iHigh and ILow that are equal, and let Op be the following bits that holds iHigh[k]=0, iLow[k]=1. Thus, the value of Step is Step=Step$_{tmp}$<<=(Eq+Op−LeftShift)

and the result of Step will be the same as in the conventional scheme.

As seen in FIG. 2, LeftShift shifts iRange according to its value and Step rescaling adjusts Step_tmp according to H, L rescaling.

As such, rescaling and range calculations are performed in parallel and the arithmetic coding can be performed on large alphabets. Also, the arithmetic coding can be adaptive such that arithmetic coding is performed fast.

In accordance with an exemplary embodiment of the present inventive concept, a fast rescaling in a symbol coding iteration can also be performed.

As discussed above, typical arithmetic coder includes the two parameters, High (H) and Low (L), which form a coding interval. The coding interval is parted in each iteration to sub-intervals according to a cumulative frequency vector, containing the appearances of each symbol. After selecting the appropriate sub-interval according to the symbol that was encoded/decoded the two new parameters, NewHigh, NewLow, are provided.

Conventionally, NewHigh and NewLow are iteratively shifted while High<0.5 of initial interval, Low>=0.5 of initial interval, or 0.25<Low<0.5<High<0.75 of initial interval.

Other methods include the parameters Low and Range instead of Low, High and Range, and shift both of them until Range is greater than a quarter of the initial interval. In the process code bits are sent (encoder)/used (decoder).

Pursuant to an exemplary embodiment of the present inventive concept the algorithm can be performed in a fast and easy manner.

In accordance with an exemplary embodiment of the present inventive concept, a fast algorithm to do the rescaling of NewHigh and NewLow is provided.

The algorithm is performed in three phases:
1. A determination is made as to how many MSBs of NewHigh and NewLow are equal and are denoted by N. The N+1 bit is then clear in NewHigh and NewLow, since they must be different, and NewHigh>NewLow. Hence, NewHigh[N+1]=1 and NewLow[N+1]=0.
2. The sequential MSBs are found such that NewHigh[i]=0 and NewLow[i]=1, i>N+1, and are denoted by M.
3. NewHigh and NewLow are shifted by N+M bits and denoted by High and Low. The MSB of High is set and the MSB of Low is erased. Then, N+M LSBs of High are set and N+M LSBs of Low are erased.

For an encoder, the MSB of High is output. Then UnderCount=!(MSB of High) is output and the rest N−1 MSBs of High are output. The new value of UnderCount is M, if N>0, and UnderCount+M otherwise.

For a decoder, Bit=code[N+1] is saved. Code is shifted by N+M and the MSB of NewCode is set to Bit. The N+M LSBs of NewCode are the sequential N+M bits from the compressed stream.

Figure 3:
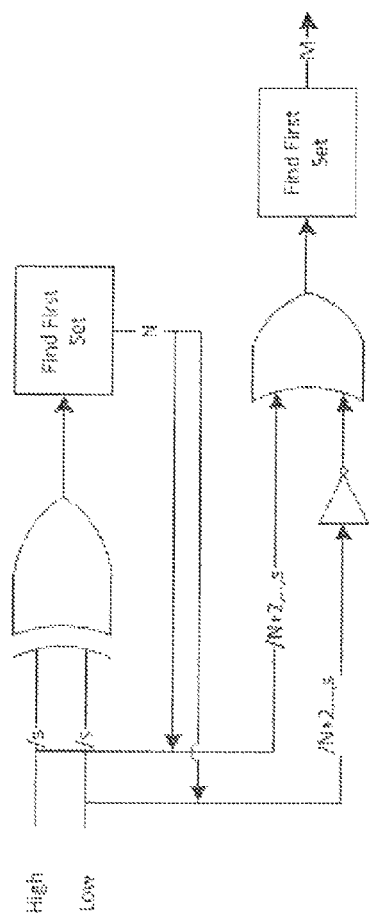
FIG. 3 is a block diagram depicting the rescaling procedure, in which the parameters N and M are calculated, according to an exemplary embodiment of the present inventive concept.
Figure 4:
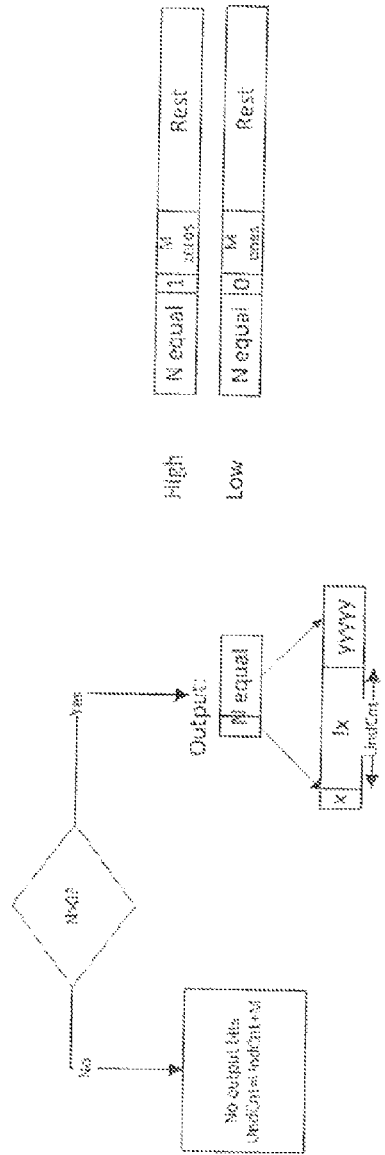
FIG. 4 is a schematic diagram depicting the rescaling procedure, in which the output bits are calculated, according to an exemplary embodiment of the present inventive concept.

FIGS. 3 and 4 depict the encoder algorithm described above and provide a schematic description thereof, respectively. The decoder algorithm is very much the same.

In accordance with the above-described exemplary embodiment of the method of the inventive concept the same result as the conventional method can be obtained, but instantaneously.

As an example, let NewHigh=11100100011101 and let NewLow=11100011101010. With N=5 and M=3, then High=11110111111111 and Low=00101000000000.

For the encoder, if the parameter UndCnt=2, then the output bits are: 1,00,1100 and now UndCnt=3.

For the decoder, the codeword must be between NewHigh and NewLow. If the code=11100100001101, then NewCode=101101********, where * is a bit from the compressed stream.

In accordance with the exemplary embodiment of the present inventive concept, a method of performing a fast rescaling of the interval bounds NewHigh and NewLow is provided. The method allows the rescaling to be done within one clock cycle. No loops are required. Output bits are provided instantaneously and input bits are given instantaneously. The arithmetic coder is done with Low and Range presentation. The number of output/input bits of rescaling is limited to a fixed number per iteration.

The methodologies of the exemplary embodiments of the present disclosure are particularly well suited for use in various electronic devices or systems.

Figure 5:
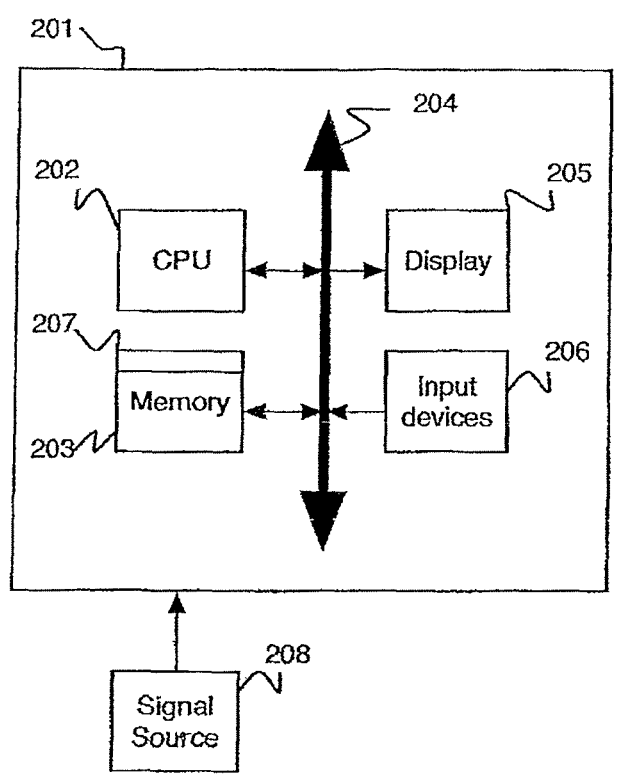
FIG. 5 is a block diagram depicting a system for implementing an exemplary embodiment of the present inventive concept.

Accordingly, as depicted in FIG. 5, exemplary embodiments may take the form of an embodiment combining software and hardware aspects that may all generally be referred to as a "processor", "circuit," "module" or "system." Furthermore, exemplary implementations may in part take the form of computer program products for executing hardware functions and embodied in one or more computer readable medium(s) having computer readable program code stored thereon.

Any combination of one or more computer usable or computer readable medium(s) may be utilized. The computer-usable or computer-readable medium may be a computer readable storage medium. A computer readable storage medium may be, for example but not limited to, an electronic, magnetic, optical, electromagnetic, infrared, or semiconductor system, apparatus, device, or any suitable combination of the foregoing. More specific examples (a non-exhaustive list) of the computer-readable storage medium would include the following: a portable computer diskette, a hard disk, a random access memory (RAM), a read-only memory (ROM), an erasable programmable read-only memory (EPROM) or Flash memory, such as NAND Flash memory, and, in particular ×4 NAND Flash memory, an optical fibre, a portable compact disc read-only memory (CD-ROM), an optical storage device, a magnetic storage device, or any suitable combination of the foregoing. In the context of this document, a computer readable storage medium may be any tangible medium that can contain or store a non-transitory program for use by or in connection with an instruction execution system, apparatus or device.

Computer program code for carrying out operations of the exemplary embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Exemplary embodiments are described herein with reference to signal arrows and/block diagrams. It will be understood that each block of the block diagrams, and combinations of blocks in the block diagrams, can be implemented by hardware accompanied by computer program instructions.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

For example, FIG. 5 is a block diagram depicting an exemplary computer system, which can utilize the devices and methodology described above. The computer system 201 may include a processor (CPU) 202, memory 203 coupled to the processor (e.g., via a bus 204 or alternative connection means), as well as input/output (I/O) circuitry 205, 206 operative to interface with the processor 202. The processor 202 may be configured to perform one or more methodologies described in the present disclosure, illustrative embodiments of which are shown in the above figures and described herein. Embodiments of the present disclosure can be implemented as a routine 207 that is stored in memory 203 and executed by the processor 202 to process a signal from the signal source 208. As such, the computer system 201 can be a general-purpose computer system that becomes a specific purpose computer system when executing the routine 207 of the present disclosure.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to a multi-core processor that contains multiple processing cores in a processor or more than one processing device, and that various elements associated with a processing device may be shared by other processing devices.

It is to be appreciated that the term "processor" as used herein is intended to include any processing device, such as, for example, one that includes a central processing unit (CPU) and/or other processing circuitry (e.g., digital signal processor (DSP), microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, and/or one or more output devices (e.g., printer, monitor, etc.) for presenting the results associated with the processor.

The block diagrams in the figures illustrate the architecture, functionality, and operation of possible implementations of systems, methods and computer program products according to various embodiments. In this regard, each block in the block diagrams may represent a module, segment, or portion of code, which comprises one or more executable instructions for implementing the specified logical function(s). It should also be noted that, in some alternative implementations by those skilled in the art, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

While exemplary embodiments have been particularly shown and described, it will be understood that various changes in form and details may be made therein without departing from the spirit and scope of the following claims.

What is claimed is:

1. A method for reducing an amount of time needed for a single iteration of arithmetic encoding and arithmetic decoding, comprising
    calculating rescaling and range in parallel, range being a High parameter (H) bound of a symbol-interval—a Low parameter (L) bound of the symbol-interval+1, by:
        finding a new iHigh parameter (iH) and a new iLow parameter (iL) for a given/decoded symbol according to a cumulative frequency CF[i] for an ith symbol, wherein iH=L+CF[i]*Step−1, iL=L+CF[i−1]*Step, and Step=Range/CF[N], N being an alphabet size;
        performing iH, iL rescaling by shifting an amount of most significant bits (MSBs) of iH, iL in accordance with values of iH and iL;
        shifting an iRange in accordance with a number of digits needed to represent iRange and a total number of bits reserved for iRange, such that LeftShift=BitReserved−1−No0fDig(iRange); and
        dividing a shifted iRange by CF[N] and saving to Step_tmp while awaiting a result of H,L rescaling to determine an adjustment needed for Step_tmp,
    wherein if Eq is a number of MSBs in iH and iL that are equal, and Op is following bits that holds iH[k]=0 and iL[k]=1, then Step=Step_tmp<<=(Eq+Op−LeftShift).

2. The method of claim 1, wherein the arithmetic encoding is for an input sequence applied to NAND flash memory and the arithmetic decoding is for an encoded output sequence from a NAND flash memory.

3. The method of claim 2, wherein the NAND flash memory is an x4 NAND flash memory.

4. A computer program product for arithmetic encoding for an input sequence applied to NAND flash memory and arithmetic decoding for an encoded output sequence from a NAND flash memory, the computer program product comprising:
    a non-transitory computer readable storage medium having computer readable program code embodied therewith, the computer readable program code comprising:
    computer readable program code configured to calculate rescaling and range in parallel, range being a High parameter (H) bound of a symbol-interval—a Low parameter (L) bound of the symbol-interval+1, by:
        finding a new iHigh parameter (iH) and a new iLow parameter (iL) for a given/decoded symbol according to a cumulative frequency CF[i] for an ith symbol, wherein iH=L+CF[i]*Step−1, iL=L+CF[i−1]*Step, and Step=Range/CF[N], N being an alphabet size;
        performing iH, iL rescaling by shifting an amount of most significant bits (MSBs) of iH, iL in accordance with values of iH and iL;
        shifting an iRange to the left in accordance with a number of digits needed to represent iRange and a total number of bits reserved for iRange, such that LeftShift=BitReserved−1−No0fDig(iRange); and
        dividing a shifted iRange by CF[N] and saving to Step_tmp while awaiting a result of H,L rescaling to determine an adjustment needed for Step_tmp,
    wherein if Eq is a number of MSBs and iL that are equal, and Op is following bits that holds iH[k]=0 and iL[k]=1, then Step=Step_tmp<<=(Eq+Op−LeftShift).

5. The method of claim 4, wherein the NAND flash memory is an x4 NAND flash memory.

6. A method for reducing an amount of time needed for rescaling during arithmetic encoding and arithmetic decoding, the method comprising:
    providing a coding interval spanning from a High parameter to a Low parameter;
    parting in each iteration the coding interval to sub-intervals according to a cumulative frequency vector containing appearances of each symbol;
    selecting a sub-interval according to a symbol that was encoded/decoded to provide a NewHigh parameter and a New Low parameter;
    determining how many most significant bits (MSBs) of the NewHigh parameter and the NewLow parameter are equal and denoting by N;
    finding and denoting by M sequential MSBs such that NewHigh[i]=0 and NewLow [i]=1, i being an iteration number;
    shifting the NewHigh parameter and the NewLow parameter by N+M bits and respectively denoting shifted parameters as the High parameter and the Low parameter;
    setting the MSB of the High parameter and erasing the MSB of the Low parameter;
    setting N+M least significant bits (LSBs) of the High parameter and erasing the LSBs of the low parameter; and
    for an encoding:
        outputting the most significant bit of the High parameter;
        outputting UnderCount !(most significant bit of the High parameter); and
        outputting N+1 most significant bits of the High parameter;
        wherein if N>0 UnderCount=0 and UnderCount=UnderCount+M; and for a decoding:
        saving bit=code [N+1]; and
        shifting code by N+M and setting the MSB of a NewCode parameter to bit,
        wherein the N+M LSBs of the NewCode parameter are N+M bits from a compressed stream.

7. The method of claim 6, wherein the arithmetic encoding is for an input sequence applied to NAND flash memory and the arithmetic decoding is for an encoded output sequence from a NAND flash memory.

8. The method of claim 7, wherein the NAND flash memory is an ×4 NAND flash memory.

* * * * *